United States Patent [19]

Mohd et al.

[11] Patent Number: 5,715,256
[45] Date of Patent: Feb. 3, 1998

[54] METHOD AND APPARATUS FOR HANDLING MULTIPLEXER CONTENTION DURING SCAN

[75] Inventors: Bassam Jamil Mohd, Sunnyvale; Song Zhang, San Jose, both of Calif.

[73] Assignee: Sun Microsystems, Inc., Mountain View, Calif.

[21] Appl. No.: 721,445

[22] Filed: Sep. 27, 1996

[51] Int. Cl.⁶ .................................................. G06F 11/00
[52] U.S. Cl. .................................................. 371/22.31
[58] Field of Search .................. 395/183.06; 371/22.31, 371/22.32, 22.36, 22.5, 22.6, 22.7

[56] References Cited

U.S. PATENT DOCUMENTS

5,631,911  5/1997  Whetsel, Jr. ........................ 371/22
5,631,912  5/1997  More, Jr. ........................... 371/22

*Primary Examiner*—Vincent P. Canney
*Attorney, Agent, or Firm*—Hecker & Harriman

[57] ABSTRACT

A method and apparatus for handling multiplexer contention during scan. During a test scan of a multiplexer circuit, it is possible for multiple inputs of a multiplexer to be selected at the same time in what is referred to as multiplexer contention. If the selected inputs are of different logical values, this contention may result in high power consumption and damage to the circuit. The invention prevents the adverse consequences of multiplexer contention by disabling one direction of the driving capability for each driving gate in the multiplexer during a scan. Thus, the multiplexer output can be driven to only one logical value regardless of the logical values of the selected inputs. A controllable impedance element, such as a transistor, is coupled between an input driving gate of a multiplexer circuit and a voltage supply node. The impedance element is responsive to a scan control signal, such that the impedance element is disabled, i.e., at high impedance, during a scan procedure. The input driving gate is therefore prevented from driving the multiplexer output towards the potential of the voltage supply node during a scan procedure. During normal operation, the impedance element is enabled, i.e., at low impedance, and the input driving gate is substantially unaffected.

27 Claims, 8 Drawing Sheets

METHOD AND APPARATUS FOR HANDLING MULTIPLEXER CONTENTION DURING SCAN

BACKGROUND OF THE INVENTION

1. FIELD OF THE INVENTION

This invention relates to the field of electronic circuit testing, and more particularly to the field of scan testing of integrated circuits (ICs).

2. BACKGROUND ART

A common element of integrated circuits is the multiplexer (MUX), which serves to select a single drive output signal from a plurality of input drive signals. One input drive signal is coupled through to the multiplexer output during normal operation of circuit. However, in circuits of the prior art, during testing of the circuit using scan techniques, coupling of more than one input drive signal to the multiplexer output can occur. This coupling of more than one input drive signal to the multiplexer output is referred to as "contention." If the contending input drive signals are of different logical values, the contention may result in undesired power consumption and damage to the circuit, such as fusing of the multiplexer output wire. A mechanism for preventing the harmful effects of multiplexer contention during scan without effecting circuit timing or circuit area during normal operation is needed.

Many electronic circuits, such as central processing units (CPUs), consist of a complex state machine. The contents of registers throughout the circuit make up the current state of the machine, with the current state lasting for one clock cycle. Combinational logic (i.e., a connected arrangement of logic gates) coupling the outputs and inputs of the registers determines what the next state will be based upon the stored binary values of the current state. At the end of a clock cycle, the register values for the new state are clocked into the respective registers.

For testing and debugging purposes, the progression between states is designed to be predictable given a known starting state. Thus, a scan technique can be used to determine whether a particular circuit is behaving as expected, and depending on the extent of the scan performed, where a defect may be located within the circuit. During a scan, known values are cycled through the circuit to exercise the combinational logic. At predetermined scan points in the circuit, the results are stored in scan registers and read out for analysis.

Figure 1:
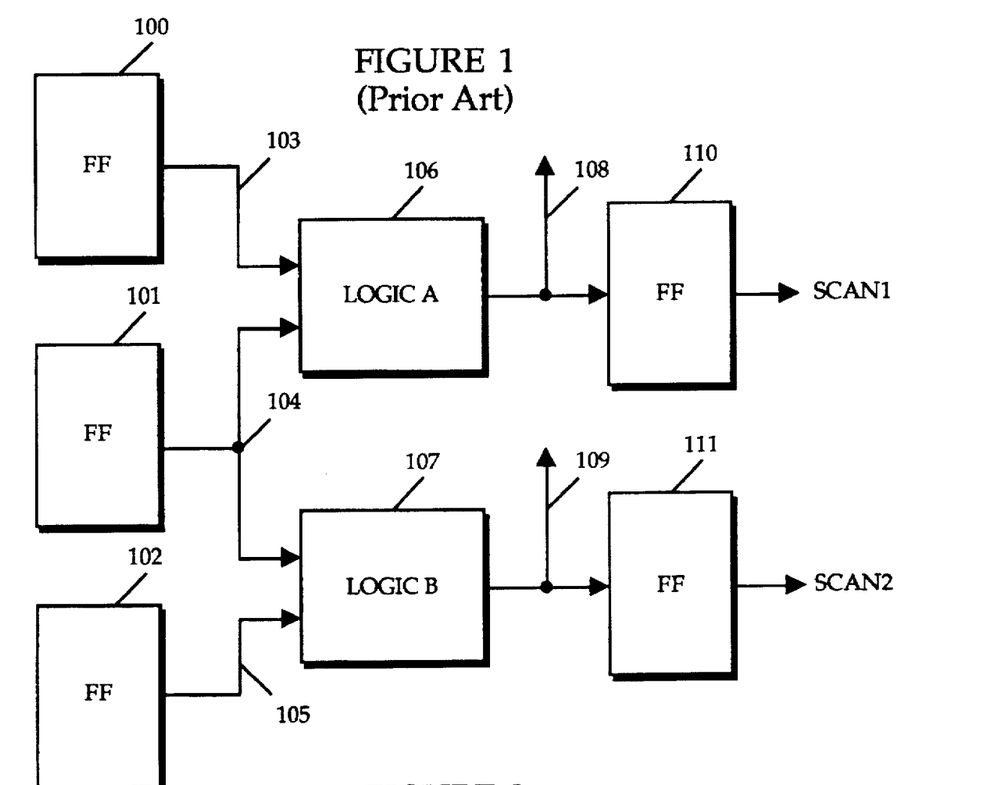
FIG. 1 is a block diagram of a sample scan circuit configuration.

FIG. 1 is a block diagram of a test scan circuit configuration comprising flip-flop registers (flip-flops) and combinational logic. In FIG. 1, flip-flop registers 100–102 are separated from flip-flop registers 110 and 111 by combinational logic blocks 106 and 107. Flip-flop 100 provides signal 103 to combinational logic block 106. Flip-flop 101 provides signal 104 to combinational logic blocks 106 and 107. Flip-flop 102 provides signal 105 to combinational logic block 107.

The output of combinational logic block 106, signal 108, comprises a scan test point. Signal 108 is provided to flip-flop 110, as well as to other circuitry. Flip-flop 110 provides the stored scan results of signal 108 as output SCAN1. The output of combinational logic block 107, signal 109, comprises a second scan point. Signal 109 is provided to flip-flop 111 and to other circuitry. Flip-flop 111 provides the stored scan results of signal 109 as output SCAN2.

Figure 2:
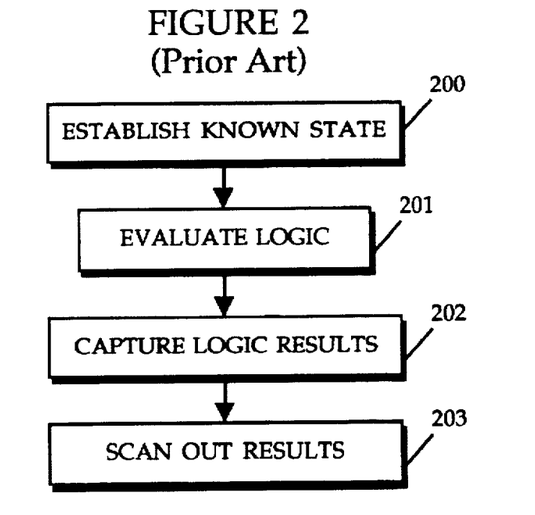
FIG. 2 is a flow diagram of a scan testing procedure.

The circuit of FIG. 1 is tested in scan mode according to the process outlined in the flow diagram of FIG. 2. In step 200 of FIG. 2, the circuit is placed in a known state. With respect to FIG. 1, establishing a known state may comprise the step of loading flip-flops 100–102 with predetermined values.

In step 201, the logic of the circuit is evaluated. Evaluation typically comprises providing sufficient time for the logic elements of combinational blocks 106–107 to provide valid output signals 108 and 109, respectively.

In step 202, the results of the logic operations are captured. This capturing step comprises the loading of flip-flops 110 and 111 with the logic results from signals 108 and 109, respectively.

In step 203, the scan results are scanned out from the scan registers for comparison with expected values. The scanning out of the results typically comprises reading of the scan values from scan registers 110 and 111 as signal SCAN1 and SCAN2, respectively. The reading of the scan results from registers 110 and 111 may be performed in a parallel or serial shift manner depending on the number of output pins available for scan output.

During a scan, it is possible for input signal combinations that are illegal during standard operation to circulate through the circuit. In the instance of a multiplexer, an illegal control input combination results in the undesired simultaneous coupling of more than one input driver to the output node. This can result in excessive power consumption and damage to the circuit.

Figure 3:
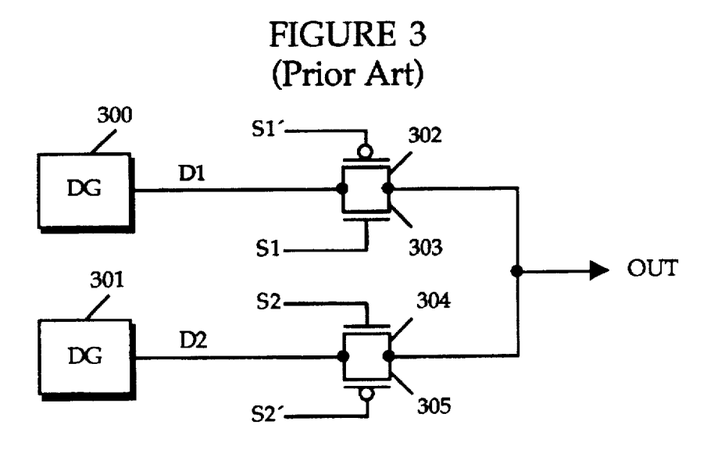
FIG. 3 is a circuit diagram of a transmission gate multiplexer.

FIG. 3 is a circuit diagram of a two-to-one multiplexer circuit. The multiplexer comprises driving gates 300 and 301 and CMOS transmission gates comprising transistors 302–305. Driving gate 300 outputs data signal D1, driving the voltage towards the upper power supply for a binary value of "1," or a voltage towards the lower power supply for a binary value of "0." Data signal D1 is provided to the drains of NMOS transistor 303 and PMOS transistor 302. The sources of NMOS transistor 303 and PMOS transistor 302 are coupled to the output node (OUT) of the multiplexer.

The gate of NMOS transistor 303 is coupled to select input signal S1. The gate of PMOS transistor 302 is coupled to select signal S1'. Together, NMOS transistor 303 and PMOS transistor 302 form a bi-directional transmission gate, transmitting data signal D1 when select input signal S1 is high and signal S1' is low, and providing an open circuit when signal S1 is low and signal S1' is high. Signal S1' is the inverse of signal S1.

Driving gate 301 provides data signal D2, driving the voltage either high or low depending on the binary value of the signal. Data signal D2 is coupled to the drain terminals of NMOS transistor 304 and PMOS transistor 350. The source terminals of transistors 304 and 305 are coupled to the output node (OUT) of the multiplexer. The gate of transistor 304 is coupled to select input signal S2. The gate of PMOS transistor 305 is coupled to select input S2'. Signal S2' is the inverse of signal S2. Transistors 304 and 305 form a second transmission gate.

During normal operation, select input signals S1 and S2 are not asserted simultaneously. Thus, data signals D1 and D2 are never coupled to the output node at the same time. The associated driving gate drives the appropriate voltage for the binary data signal when a transmission gate is not enabled, but the signal is not passed through the transmission gate. When neither transmission gate is enabled, there is no driving signal on the output node. However, the multiplexer circuit is sometimes provided with latching circuitry to maintain a voltage on the output node when neither transmission gate is enabled. Commonly, the output node of the multiplexer is coupled to the input of another logic gate which, for CMOS circuitry, provides a capacitive load. Aside from leakage current, driving gates 300 and 301 are responsible for charging and discharging the output node.

Figure 4:
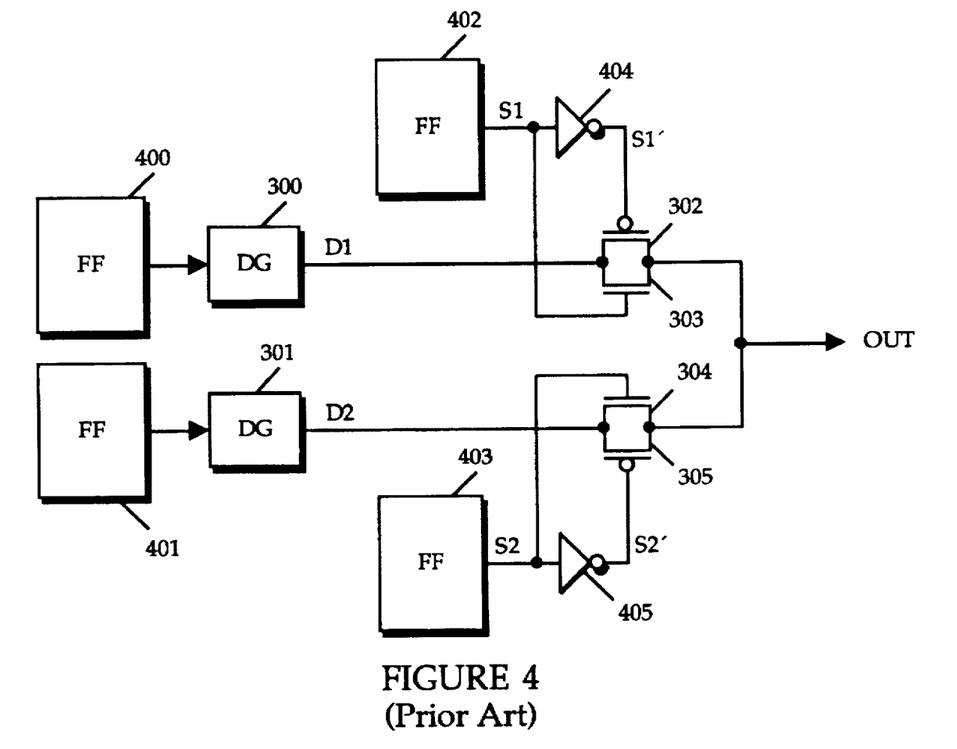
FIG. 4 is a circuit diagram of a multiplexer with input scan registers.

FIG. 4 is a circuit block diagram of a two-to-one multiplexer having flip-flops at the data inputs and the select control inputs. The primary components of the multiplexer circuit, i.e., driving gates 300–301 and transistors 302–305, are configured as described with respect to FIG. 3. Flip-flop 400 is coupled to driving gate 300, and provides a data input signal that subsequently becomes data signal D1. Similarly, flip-flop 401 is coupled to driving gate 301 to provide an input signal that subsequently becomes data signal D2. Flip-flop 402 provides select signal S1 to the gate of NMOS transistor 303 and to the input of inverter 404. The output of inverter 404 is provided as signal S1' to the gate of PMOS transistor 302. Similarly, flip-flop 403 provides select signal S2 to the gate of NMOS transistor 304 and to the input of inverter 405. Inverter 405 is coupled to the gate of PMOS transistor 305 to provide select signal S2'.

During a test scan procedure, flip-flops 400–403 are loaded with different scan values for testing purposes. A problem arises when flip-flops 402 and 403 are each loaded with a logical "1." This can occur as various binary combinations are shifted through the registers. This situation, with select signals S1 and S2 both asserted, results in the output node (OUT) being driven by both driving gates 300 and 301 simultaneously. Thus, a state of contention exists. If driving gate 300 and driving gate 301 are asserting identical data signals D1 and D2, then the output node will take on the data value of D1 and D2. However, if driving gate 300 attempts to drive a logical "1" value while driving gate 301 attempts to drive a logical "0" value, or if driving gate 300 attempts to drive a logical "0" value while driving gate 301 attempts to drive a logical "1" value, the output node will be driven in two directions at once.

Opposing drive contention results in a voltage output dependent upon the relative drive capabilities of the contending driving gates. In a CMOS circuit, the driving gate driving the logical "1" provides a low impedance path to the upper voltage supply whereas the driving gate driving the logical "0" provides a low impedance path to the lower voltage supply. As a result, a large current may flow between the upper and lower voltage supplies through the output node, possibly fusing the output node connection.

SUMMARY OF THE INVENTION

A method and apparatus for handling multiplexer contention during scan is described. During a test scan of a multiplexer circuit, it is possible for multiple inputs of a multiplexer to be selected at the same time in what is referred to as multiplexer contention. If the selected inputs are of different logical values, this contention may result in high power consumption and damage to the circuit. The invention prevents the adverse consequences of multiplexer contention by disabling one direction of the driving capability for each driving gate in the multiplexer during a scan. This is done by forming a high impedance between each driving gate and one of the voltage supply nodes. Thus, the multiplexer output can be driven to only one logical value regardless of the logical values of the selected inputs.

In an embodiment of the invention, a controllable impedance element, such as a transistor, is coupled between an input driving gate of a multiplexer circuit and a voltage supply node. The impedance element is responsive to a scan control signal, such that the impedance element is disabled, i.e., at high impedance, during a scan procedure. The input driving gate is therefore prevented from driving the multiplexer output towards the potential of the voltage supply node during a scan procedure. During normal operation, the impedance dement is enabled, i.e., at low impedance, and the input driving gate is substantially unaffected. In one embodiment, the controllable impedance element is an NMOS transistor, and the voltage supply node is the lower voltage supply for the circuit. In a second embodiment, the impedance element is a PMOS transistor, and the voltage supply node is the upper voltage supply for the circuit. Also, one impedance element may be used to disable more than one input driving gate.

To prevent floating of the multiplexer output node during scan, one embodiment of the invention includes a second impedance element coupled between the output node and a second voltage supply node. During a scan procedure, this second impedance element is enabled to pull the voltage at the multiplexer output node to the potential of the second voltage supply node. During normal operation, the second impedance element is disabled. In another embodiment, a latch is coupled to the multiplexer output node to prevent floating of the output.

DETAILED DESCRIPTION OF THE INVENTION

The invention is a method and apparatus for handling multiplexer contention during scan. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

The invention may be implemented in any integrated circuits that implement scan testing, such as microprocessors, ASICs (application specific integrated circuits), gate arrays, etc. A computer system may comprise one or more of such circuits for improved testability. Implementation of the present invention in the computer system can reduce the costs associated with replacing components damaged during scan testing procedures.

In many digital circuits, binary logic values are represented by a voltage signal. Voltage values above a specific threshold are considered as a logical "1", whereas voltage values below the specific threshold are considered as a logical "0". In many logic circuits, such as those implemented using CMOS technology, the output signal of a logic gate, or driving gate, is pulled towards an upper or lower voltage supply node by providing a low impedance path between the output node of the gate and the respective voltage supply node. At the same time, a relatively high impedance is established between the output node and the opposing voltage supply node.

The problems associated with multiplexer contention, e.g., power consumption and line fusing, are caused by the simultaneous low impedance coupling of the multiplexer output node to the upper and lower voltage supply nodes by two different driving gates. A large electrical current is permitted to flow between the voltage supply nodes, which may exceed the maximum current rating for the IC process and fuse the output node.

Figure 5:
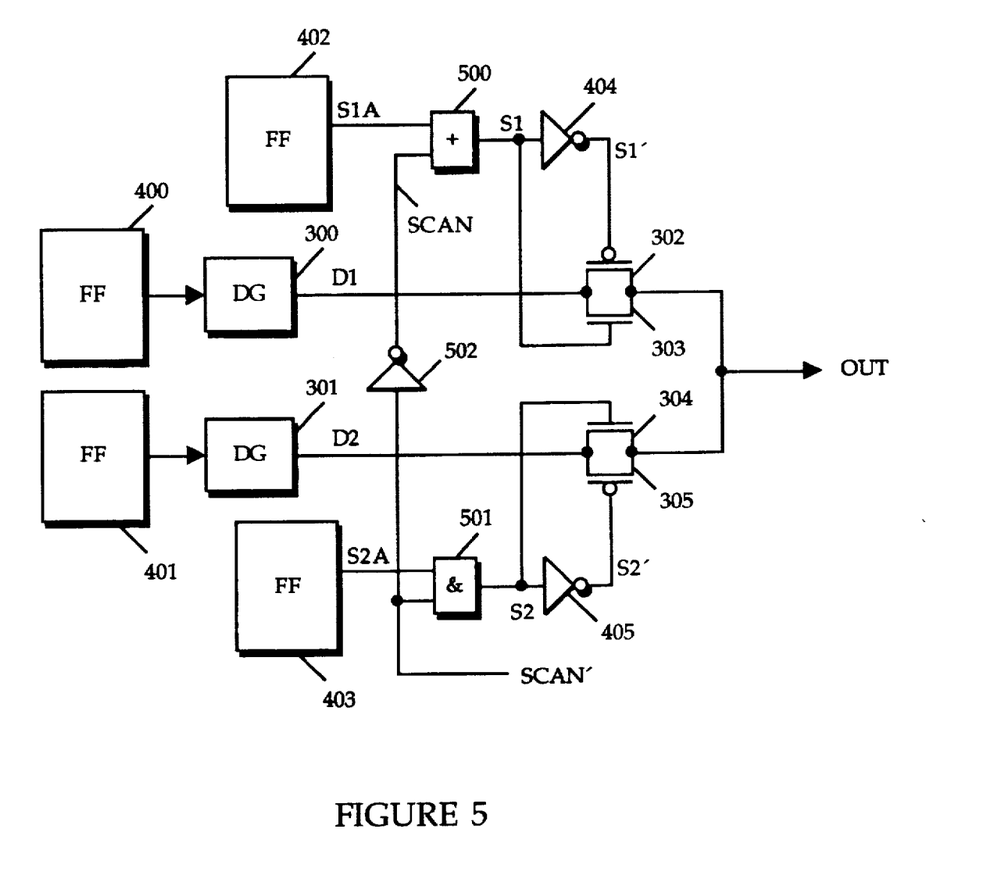
FIG. 5 is a block diagram of a multiplexer having scan contention circuitry in the control path.

FIG. 5 is a circuit block diagram of a two-to-one multiplexer for handling multiplexer contention which incorporates scan contention circuitry in the control path to prevent simultaneous driving of the output node by more than one driving gate. In FIG. 5, flip-flop 400 is coupled to driving gate 300 which in turn provides data signal D1 to the drains of transistors 302 and 303, which form a transmission gate. The sources of transistors 302 and 303 are coupled to the output node, labeled OUT. Flip-flop 401 is coupled to driving gate 301, which in turn provides data signal D2 to the drains of transistors 304 and 305. The sources of transistors 304 and 305 are coupled to the output node (OUT). Transistors 304 and 305 form a second transmission gate.

Flip-flop 402 provides select signal S1A to OR gate 500. OR gate 500 provides select signal S1 to the gate of NMOS transistor 303 and to the input of inverter 404. Inverter 404 provides inverted select signal S1' to the gate of PMOS transistor 302. Flip-flop 403 provides signal S2A to AND gate 501. AND gate 501 provides select signal S2 to the gate of NMOS transistor 304 and to the input of inverter 405. Inverter 405 provides inverted select signal S2' to the gate of PMOS transistor 305. A scan control signal, SCAN', is coupled to AND gate 501 and to inverter 502. Inverter 502 provides the inverse of the control signal, SCAN, to OR gate 500.

During normal operation of the multiplexer, SCAN' is asserted. AND gate 501 acts as a pass-through circuit such that signal S2 is equal to signal S2A. Also, OR gate 500 acts as a pass-through circuit such that signal S1 is equal to signal S1A. Thus, the multiplexer contention circuitry does not affect the normal logical operation of the circuit.

During a scan procedure, signal SCAN' is deasserted. Due to the AND logic of block 501, signal S2 is automatically deasserted, disabling the transmission gate comprising transistors 304 and 305. Similarly, due to the OR circuitry of block 500 in combination with inverter 502, signal S1 is automatically asserted, enabling the transmission gate formed by transistors 302 and 303. In multiplexer embodiments having additional inputs, another AND block similar to block 501 serves to disable the additional inputs as well.

Thus, the multiplexer contention circuitry in the control path for the multiplexer ensures that only one driving gate is driving the output node during a scan.

The disadvantages of the circuit of FIG. 5 are that the additional logic blocks 500–502 take up additional circuit area and contribute to the time delay in the control path of the multiplexer circuit itself. Thus, the prevention of multiplexer contention during a scan operation entails a reduction in performance during normal operation of the circuit, as well as increasing the required circuit layout area.

Figure 6:
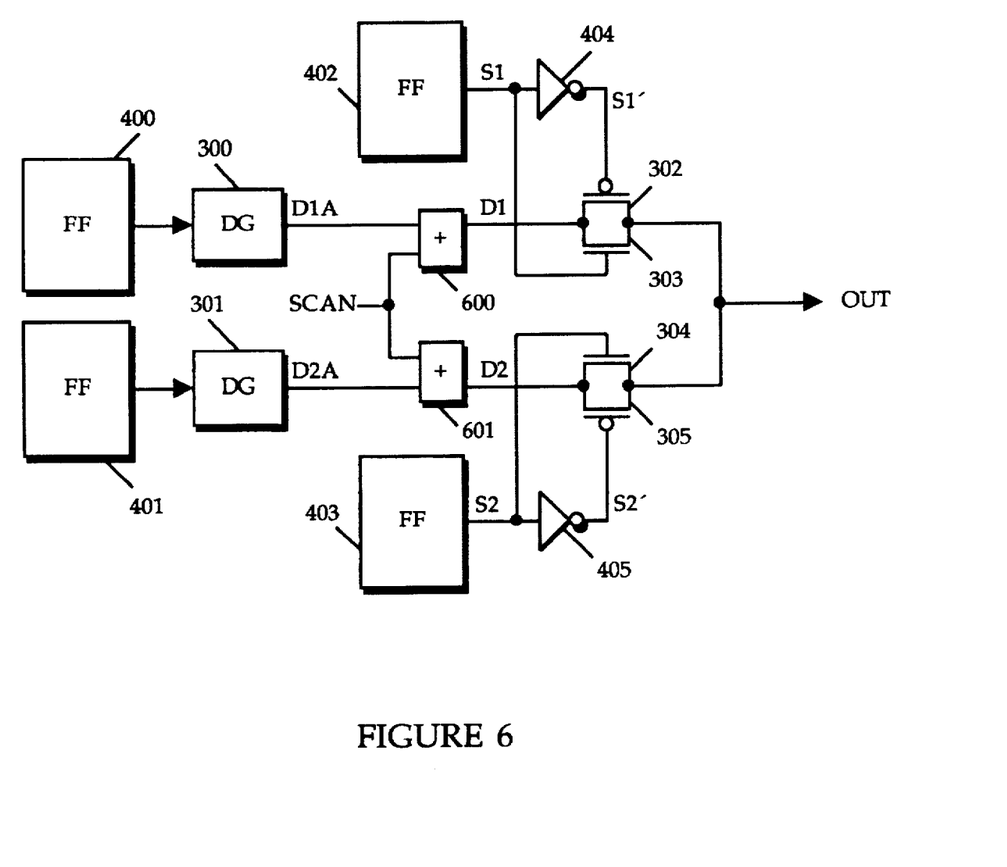
FIG. 6 is a multiplexer having scan contention circuitry in the data path.

FIG. 6 is a circuit block diagram of a multiplexer for handling multiplexer contention which incorporates scan contention circuitry in the data path to prevent opposing input values from propagating when contention occurs during a scan. In FIG. 6, flip-flop 400 is coupled to driving gate 300. Driving gate 300 provides data signal D1A to OR gate 600, which provides data signal D1 to the drains of transistors 302 and 303. The sources of transistors 302 and 303 are coupled to the output node (OUT). Flip-flop 401 is coupled to driving gate 301. Driving gate 301 provides data signal D2A to OR gate 601, which provides data signal D2 to the drains of transistors 304 and 305. The sources of transistors 304 and 305 are coupled to the output node (OUT).

Flip-flop 402 provides select signal S1 to the gate of NMOS transistor 303 and to inverter 404. Inverter 404 provides inverted select signal S1' to the gate of PMOS transistor 302. Flip-flop 402 provides select signal S2 to the gate of NMOS transistor 304 and to inverter 405. Inverter 405 provides inverted select signal S2' to the gate of PMOS transistor 305. A scan control signal, SCAN, is provided to OR gates 600 and 601 to control multiplexer contention.

During normal operation, the scan control signal is a logical "0." Due to the OR logic of blocks 600 and 601, data signals D1A and D2A are passed through to data signals D1 and D2, respectively, and normal logical operation of the circuit is maintained.

During a scan procedure, the scan control signal is asserted, forcing a logical "1" on signals D1 and D2 at the outputs of blocks 600 and 601. Further inputs on larger multiplexers are also configured with an OR logic block to generate a logical "1" during scan. Because all of the data signals are driven to the upper voltage supply by the OR logic blocks, if there is contention at the output node, there is no low impedance path between the upper voltage supply and the lower voltage supply.

A similar circuit to that of FIG. 6 may be formed by replacing the OR logic of blocks 600 and 601 with AND logic, and inverting the scan control input signal. This alternate circuit serves to drive the data signals D1 and D2 to the lower voltage supply corresponding to a logical "0." Thus, if there is contention at the output node, there is no low impedance path between the upper voltage supply and the lower voltage supply.

Similarly to the circuit of FIG. 5, the disadvantages of the circuit of FIG. 6 are that the logic of blocks 600 and 601 utilize additional integrated circuit layout area and increase the time delay in the data path of the multiplexer circuit. The performance and size of the circuit are thus adversely affected.

An embodiment of the invention prevents any simultaneous low impedance coupling between voltage supply nodes during a scan procedure by forming a high impedance, with a controllable impedance element such as a transistor, in the drive path between each of the driving gates and at least one of the voltage supply nodes. The driving gates are therefore limited to driving the output node toward one of the voltage supply nodes. During normal operation, the controllable impedance element forms a low impedance. The driving gate is then permitted to drive the output node toward either voltage supply node. The controllable impedance element may be implemented as a transistor that is enabled to form a low impedance, or disabled to form a high impedance.

Figure 7:
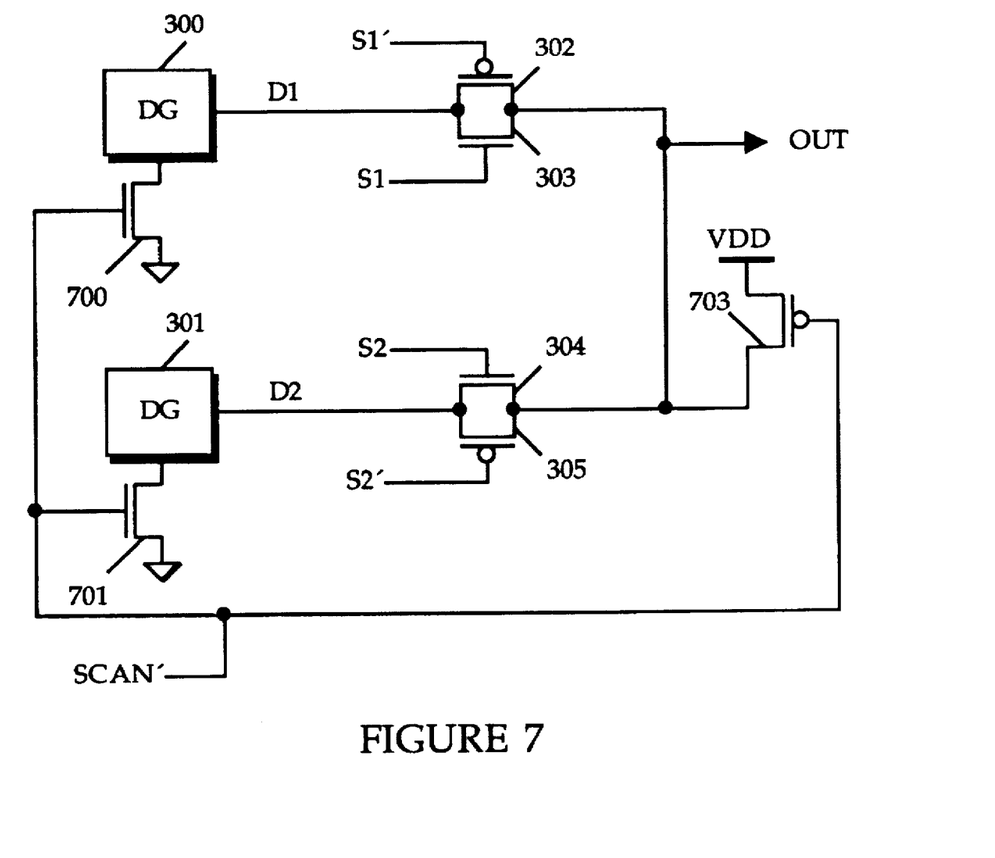
FIG. 7 is a circuit diagram of a multiplexer having scan contention circuitry according to one embodiment of the invention.

FIG. 7 is a circuit block diagram of a multiplexer having driving gate disabling transistors in accordance with an embodiment of the invention. In FIG. 7, driving gate 300 provides data signal D1 to the drains of transistors 302 and 303. The sources of transistors 302 and 303 are coupled to the output node (OUT) of the multiplexer. The gate of NMOS transistor 303 is coupled to select signal S1, whereas the gate of PMOS transistor 302 is coupled to the inverted select signal S1'.

Driving gate 301 provides data signal D2 to the drains of transistors 304 and 305. The sources of transistors 304 and 305 are coupled to the output node of the multiplexer. Select signal S2 is provided to the gate of NMOS transistor 304, whereas the inverted select signal S2' is provided to the gate of PMOS transistor 305. Though not shown for reasons of clarity, driving gates 300 and 301 may be coupled to flip-flops such as flip-flops 400 and 401 in FIG. 6. Also, select signals S1, S1', S2, and S2' may be provided by circuitry corresponding to elements 402-405 from FIG. 6.

Coupled between driving gate 300 and the lower voltage supply is NMOS transistor 700. The drain of NMOS transistor 700 is coupled to driving gate 300, whereas the source of NMOS transistor 700 is coupled to the lower voltage supply. Similarly, NMOS transistor 701 is coupled between driving gate 301 and the lower voltage supply. The gates of NMOS transistors 700 and 701 are driven by the inverted scan control signal, SCAN'. PMOS transistor 703 is coupled between the upper voltage supply and the output node. The source of transistor 703 is coupled to the upper voltage supply whereas the drain of transistor 703 is coupled to the output node. The gate of transistor 703 is also driven by the scan control signal, SCAN'.

During normal operation, SCAN' is asserted. Transistors 700 and 701 provide a low impedance path between driving gates 300 and 301, respectively, to the lower voltage supply. Thus, driving gates 300 and 301 are enabled for normal driving of data signals D1 and D2, respectively. PMOS transistor 703 is disabled and therefore acts as a high impedance or open circuit between the upper voltage supply and the output node.

During a scan procedure, the scan control signal SCAN' is deasserted, thus disabling NMOS transistors 700 and 701. NMOS transistors 700 and 701 act as open circuits between driving gates 300 and 301, respectively, and the lower voltage supply. The result of disabling transistors 700 and 701 is that the ability of driving gate 300 and driving gate 301 to drive data signals D1 and D2, respectively, towards the lower voltage supply is temporarily disrupted. Thus, if driving gate 300 or driving gate 301 attempt to drive their respective data signals towards the lower voltage supply, the data signals will float, i.e., act as a tri-stated output. A low impedance path between the upper voltage supply and the lower voltage supply due to multiplexer contention is therefore avoided.

It is typically not desirable to have a floating node in the circuit. For this reason, transistor 703 provides for a low impedance path between the upper voltage supply and the output node during a scan operation. The multiplexer circuit thus maintains a logical "1" at the output during scan operations.

The added cost of implementing the circuit of FIG. 7 is small, in that only one transistor is added to the driving gate of each input. The circuit area required to implement the additional transistors is minimal and the increased time delay incurred is substantially negligible.

A similar embodiment of the invention may be constructed by replacing the NMOS transistors 700 and 701 with corresponding PMOS transistors between driving gates 300 and 301, respectively, and the upper voltage supply. Also, PMOS transistor 703 is replaced with an NMOS transistor between the output node and lower voltage supply, and the scan control input is inverted. The embodiment of FIG. 7 would be preferred over this similar embodiment because of the superior performance characteristics of NMOS transistors over PMOS transistors.

Figure 8:
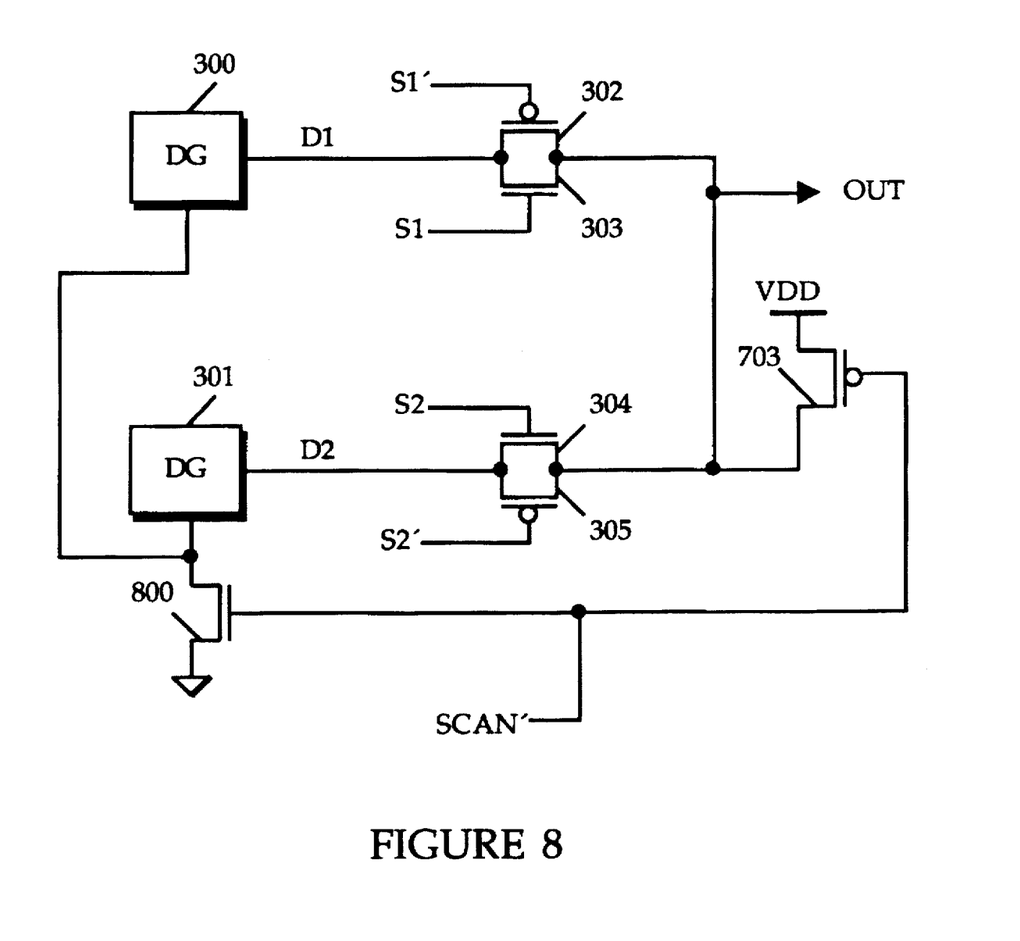
FIG. 8 is a circuit diagram of a multiplexer having scan contention circuitry according to a second embodiment of the invention.

FIG. 8 is a circuit block diagram of a multiplexer with multiplexer contention circuitry according to a second embodiment of an invention. The circuit of FIG. 8 is similar to that of FIG. 7, except that NMOS transistors 700 and 701 of FIG. 7 are combined into a single NMOS transistor 800 in FIG. 8. The drain of NMOS transistor 800 is commonly coupled to driving gates 300 and 301, whereas the source of NMOS transistor 800 is coupled to the lower voltage supply. The gate of NMOS transistor 800 is coupled to scan control input SCAN'.

The operation of the circuit of FIG. 8 is substantially identical to that of the circuit of FIG. 7. However, NMOS transistor 800 may be of increased size to accommodate the additional load of multiple driving gates in parallel. Again, the cost for implementing the circuit of FIG. 8 in additional integrated circuit layout area and timing delay are significantly less than the alternatives of FIGS. 5 and 6.

An alternative embodiment may be implemented using a single PMOS transistor between the upper voltage supply and the driving gates instead of a single NMOS transistor between the lower voltage supply and the driving gates. However, NMOS transistor characteristics are superior to those of PMOS transistor, and therefore, the NMOS transistor implementation is preferred. Also, a single disabling transistor may be coupled to driving gates from more than one multiplexer.

Figure 9:
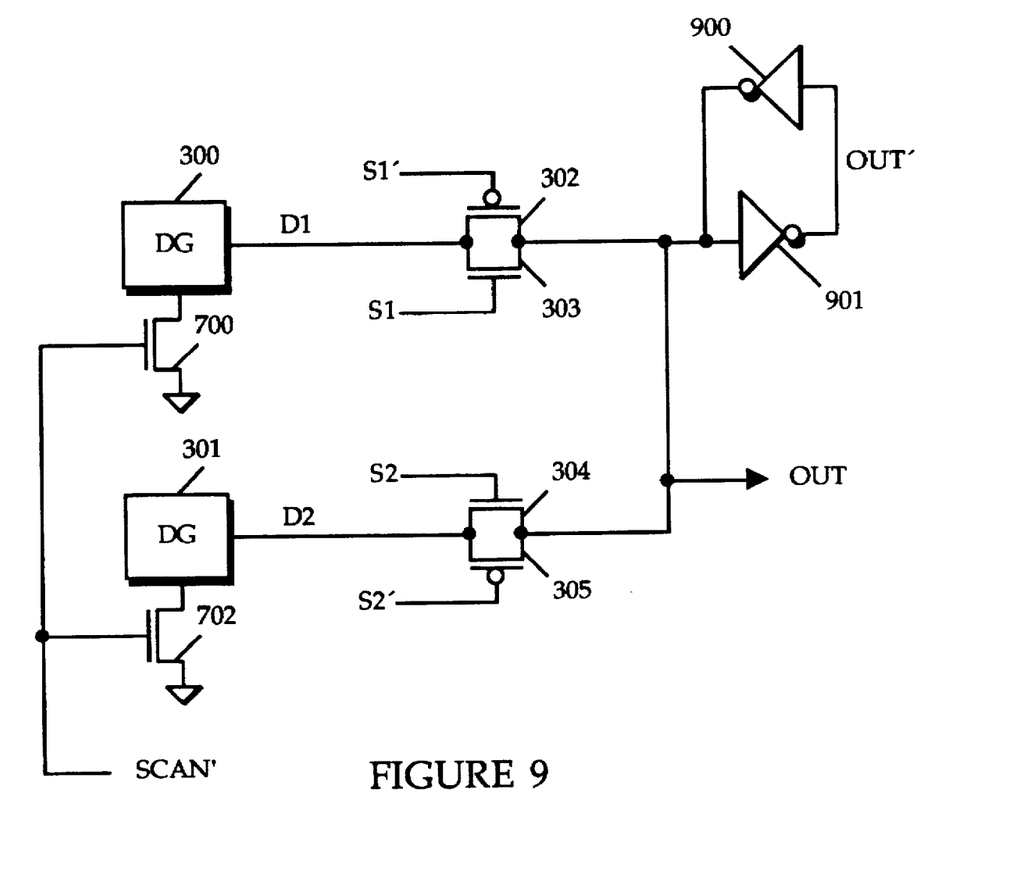
FIG. 9 is a circuit diagram of a multiplexer having scan contention circuitry according to a third embodiment of the invention.

FIG. 9 is a circuit block diagram of a multiplexer having multiplexer contention circuitry similar to that shown in FIGS. 7 and 8, but for the replacement of PMOS transistor 703 with a latching circuit comprising inverters 900 and 901.

As described with respect to FIG. 7 and 8, a mechanism for preventing the output node of the multiplexer from floating is sometimes desired. In the circuit of FIG. 9, inverters 900 and 901 serve in the capacity of a latch for the output node, providing constant drive for the output node in either the logical "1" or the logical "0" value. The input of inverter 901 is coupled to the output node (OUT), whereas the output of inverter 901 (OUTPUT') is provided to the input of inverter 900. The output of inverter 900 is fed back to the output node of the multiplexer to form a loop having the performance characteristics of a latch.

The driving characteristics of the latch formed by inverters 900 and 901 is inferior to the driving ability of either of driving gates 300 or 301. Thus, in normal operation, the output node may be easily driven by either driving gate 300 or driving gate 301. However, when neither driving gate 300 or driving gate 301 is driving the output node in the direction of either the upper or lower voltage supply, the feedback provided by inverters 900 and 901 will maintain the output node at the previously driven voltage. It is unnecessary to utilize the latching circuit of inverters 900 and 901 in tandem with a PMOS transistor such as transistor 703 of FIG. 8. Either embodiment serves to keep the output node of the multiplexer from floating in an undesired tri-state mode.

Figure 10:
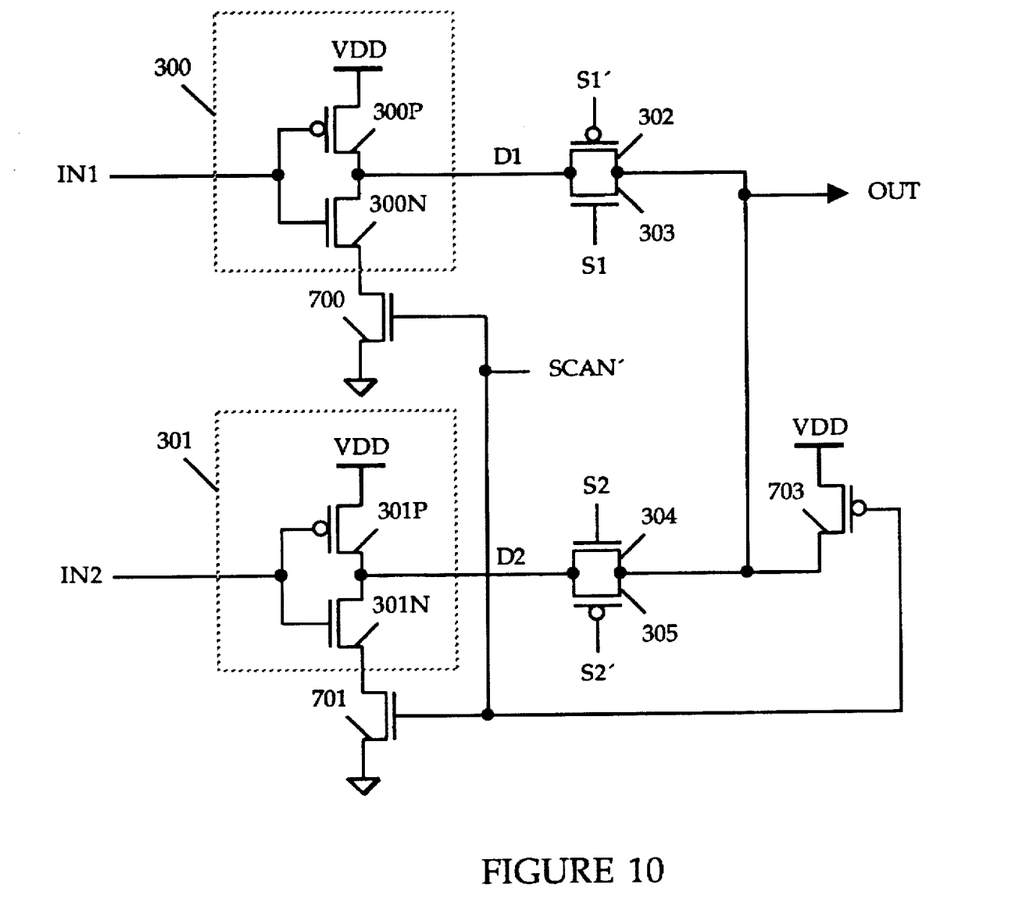
FIG. 10 is a more detailed circuit diagram of a multiplexer having scan contention circuitry according to the first embodiment of the invention.

FIG. 10 is a more detailed circuit block diagram of the multiplexer with multiplexer contention circuitry from FIG. 7. In FIG. 10, driving gate 300 comprises PMOS transistor 300P and NMOS transistor 300N. The source of PMOS transistor 300P is coupled to the upper voltage supply, and the drain of transistor 300P is coupled to the drain of NMOS transistor 300N. The source of NMOS transistor 300N is coupled to the drain of scan control transistor 700. The gates of transistors 300P and 300N form a common input for signal IN1. The common node at the drains of transistors 300P and 300N is further coupled to the drains of transistors 302 and 303 to provide data signal D1. In this example, driving gate 300 is an inverter. Therefore, data signal D1 is the inverse of signal IN1. The sources of transistors 302 and 303 are coupled to the output node, OUT. The gates of NMOS transistor 303 and PMOS 302 are coupled to select signals S1 and S1', respectively.

Driving gate 301 comprises NMOS transistor 301N and PMOS transistor 301P. The source of transistor 301P is coupled to the upper voltage supply whereas the drain of transistor 301P is coupled to the drain of transistor 301N. The source of transistor 301N is coupled to the drain of scan control transistor 701. The gates of transistors 301P and 301N are coupled to input signal IN2. The common drain node of transistors 301P and 301N are coupled to the drains of transistors 304 and 305 to transmit data signal D2. Data signal D2 is the inverse of input signal IN2 in this embodiment. The sources of transistors 304 and 305 are coupled to the output node (OUT) of the multiplexer. The gates of NMOS transistor 304 and PMOS transistor 305 are coupled to select signals S2 and S2', respectively.

The sources of scan control transistor 700 and 701 are coupled to the lower voltage supply whereas the gates are coupled to scan control input SCAN'. The gate of PMOS transistor is also driven by scan control signal SCAN'. The source of transistor 703 is coupled to the upper voltage supply whereas the drain is coupled to the output node.

In operation, the circuit of FIG. 10 is identical to that of FIG. 7 wherein transistors 302 and 303 form a first transmission gate and transistors 304 and 305 form a second transmission gate. Driving gates 300 and 301 serve to drive data signals D1 and D2, respectively, towards either the upper voltage supply or the lower voltage supply. During a scan procedure, the scan control signal SCAN' is deasserted, shutting off NMOS scan control transistor 700 and 701. Thus, the ability of driving gates 300 and 301 to drive data signals D1 and D2 towards the lower voltage supply via transistors 300N or 301N, respectively, is disabled during scan mode.

The inversion of the input signal by the driving gates may be compensated by a further inverter or inverting logic in the signal path either in front of, or behind, the multiplexer circuit.

Thus a method and apparatus for handling multiplexer contention during scan has been described in conjunction with one or more specific embodiments. The invention is defined by the claims and their full scope of equivalents.

We claim:

1. A multiplexer circuit comprising:
an input driving gate selectively coupled to an output node; and
a controllable impedance element coupled between said input driving gate and a voltage supply node, wherein said controllable impedance element is disabled in response to a scan control signal.

2. The multiplexer circuit of claim 1 wherein said voltage supply node is a lower voltage supply.

3. The multiplexer circuit of claim 2 wherein said controllable impedance element is an NMOS transistor.

4. The multiplexer circuit of claim 1 wherein said voltage supply node is an upper voltage supply.

5. The multiplexer circuit of claim 4 wherein said controllable impedance element is a PMOS transistor.

6. The multiplexer circuit of claim 1 further comprising:
a second input driving gate selectively coupled to said output node, wherein said controllable impedance element is further coupled between said second input driving gate and said voltage supply node.

7. The multiplexer circuit of claim 1 further comprising:
a second input driving gate selectively coupled to said output node; and
a second controllable impedance element coupled between said second input driving gate and said voltage supply node, wherein said second controllable impedance element is responsive to said scan control signal.

8. The multiplexer circuit of claim 1 further comprising:
a latch circuit coupled to said output node.

9. The multiplexer circuit of claim 1 further comprising:
a third controllable impedance element coupled between said output node and a second voltage supply node, wherein said third controllable impedance element is responsive to said scan control signal.

10. The multiplexer circuit of claim 1 further comprising:
a transmission gate coupled between said first input driving gate and said output node, said transmission gate responsive to a select signal.

11. The multiplexer circuit of claim 10 further comprising:
a scan register coupled to said transmission gate to provide said select signal.

12. A method of handling multiplexer contention during scan, comprising the steps of:
during a scan procedure, forming a high impedance between an input driving gate of a multiplexer and a voltage supply node; and
during normal circuit operation, forming a low impedance between said input driving gate and said voltage supply node.

13. The method of claim 12 wherein said step of forming a high impedance further comprises the step of:
disabling a transistor coupled between said driving gate and said voltage supply node.

14. The method of claim 12 wherein said step of forming a low impedance further comprises the step of:
enabling a transistor coupled between said driving gate and said voltage supply node.

15. The method of claim 12 further comprising the step of:
asserting a scan control signal during said scan procedure.

16. The method of claim 12 further comprising the step of:
forming a low impedance between an output node of said multiplexer and a second voltage supply node during said scan procedure.

17. The method of claim 12 further comprising the step of:
latching a signal value at an output node of said multiplexer.

18. A computer system comprising:
an integrated circuit having a test scan configuration comprising a plurality of scan registers coupled to combinational logic circuitry, wherein said combinational logic circuitry further comprises:

a multiplexer circuit having an input driving gate selectively coupled to an output node; and a controllable impedance element coupled between said input driving gate and a voltage supply node, wherein said controllable impedance element is disabled in response to a scan control signal.

19. The computer system of claim 18 wherein said voltage supply node is a lower voltage supply.

20. The computer system of claim 19 wherein said controllable impedance element is an NMOS transistor.

21. The computer system of claim 18 wherein said voltage supply node is an upper voltage supply.

22. The computer system of claim 21 wherein said controllable impedance element is a PMOS device.

23. The computer system of claim 18 wherein said multiplexer circuit further comprises:

a second input driving gate selectively coupled to said output node, wherein said controllable impedance element is further coupled between said second input driving gate and said voltage supply node.

24. The computer system of claim 18 wherein said combinational logic circuitry further comprises:

a second input driving gate selectively coupled to said output node; and a second controllable impedance element coupled between said second input driving gate and said voltage supply node, wherein said second controllable impedance element is responsive to said scan control signal.

25. The computer system of claim 18 wherein said combinational logic circuitry further comprises:

a latch circuit coupled to said output node.

26. The computer system of claim 18 wherein said combinational logic circuitry further comprises:

a third controllable impedance element coupled between said output node and a second voltage supply node, wherein said third controllable impedance element is responsive to said scan control signal.

27. The computer system of claim 18 wherein said multiplexer circuit further comprises:

a transmission gate coupled between said first input driving gate and said output node, said transmission gate responsive to a select signal from a scan register.

* * * * *